United States Patent
Kim (10) Patent No.: US 11,749,549 B2
(45) Date of Patent: Sep. 5, 2023

(54) SUBSTRATE PROCESSING APPARATUS WITH AN AIR CURTAIN IN A LOADING/UNLOADING PART

(71) Applicant: KCTECH CO., LTD., Anseong-si (KR)

(72) Inventor: Dong Min Kim, Seoul (KR)

(73) Assignee: KCTECH CO., LTD., Anseong-si (KR)

( * ) Notice: Subject to any disclaimer, the term of this patent is extended or adjusted under 35 U.S.C. 154(b) by 196 days.

(21) Appl. No.: 16/748,834

(22) Filed: Jan. 22, 2020

(65) Prior Publication Data

US 2020/0294832 A1 Sep. 17, 2020

(30) Foreign Application Priority Data

Mar. 15, 2019 (KR) .................. 10-2019-0030097

(51) Int. Cl.
| | | |
|---|---|---|
| H01L 21/677 | (2006.01) | |
| C23C 16/44 | (2006.01) | |
| H01L 21/67 | (2006.01) | |
| B24B 57/02 | (2006.01) | |
| B05C 11/06 | (2006.01) | |
| B05D 3/04 | (2006.01) | |

(52) U.S. Cl.
CPC ........ *H01L 21/67739* (2013.01); *B05C 11/06* (2013.01); *B24B 57/02* (2013.01); *C23C 16/4412* (2013.01); *H01L 21/6719* (2013.01); *B05D 3/04* (2013.01); *H01L 21/67051* (2013.01); *Y10S 55/29* (2013.01); *Y10S 414/139* (2013.01)

(58) Field of Classification Search
CPC ......... H01L 21/67739; H01L 21/67051; H01L 21/67126; H01L 21/67748; H01L 21/6719; B24B 57/02; Y10S 55/29; Y10S 414/139; B05B 12/18; Y10T 29/49719; C23C 16/4412
USPC .................................... 438/941; 55/DIG. 18
See application file for complete search history.

(56) References Cited

U.S. PATENT DOCUMENTS

| | | | | |
|---|---|---|---|---|
| 4,915,622 A | * | 4/1990 | Witmer ..................... | F24F 9/00 432/115 |
| 5,167,572 A | * | 12/1992 | Etkin ..................... | B08B 15/023 454/191 |
| 5,210,959 A | * | 5/1993 | Brestovansky ..... | C23C 16/4408 34/210 |
| 5,746,434 A | * | 5/1998 | Boyd ................ | H01J 37/32458 414/217 |

(Continued)

FOREIGN PATENT DOCUMENTS

KR 1020150064494 A 6/2015

*Primary Examiner* — Karl Kurple
(74) *Attorney, Agent, or Firm* — STIP Law Group, LLC (57) ABSTRACT

The present disclosure relates to a substrate processing apparatus, and more specifically, to a substrate processing apparatus capable of blocking the introduction of external air and external particles into a chamber by forming an air curtain at a loading/unloading part when the chamber is open. The substrate processing apparatus of the present disclosure includes a chamber in which a space is formed, and a fluid injection part configured to inject a fluid from an outer side of a substrate loading/unloading part of the chamber through which a substrate is loaded and unloaded.

16 Claims, 10 Drawing Sheets

(56) References Cited

U.S. PATENT DOCUMENTS

| | | | | |
|---|---|---|---|---|
| 5,911,834 | A * | 6/1999 | Fairbairn | C23C 16/45572 |
| | | | | 134/1.3 |
| 8,104,770 | B2 * | 1/2012 | Datta | H01L 21/67126 |
| | | | | 277/944 |
| 9,583,363 | B2 * | 2/2017 | Falster | C30B 25/12 |
| 9,583,364 | B2 * | 2/2017 | Falster | H01L 21/302 |
| 10,586,717 | B2 * | 3/2020 | Wen | H01L 21/67161 |
| 2004/0200736 | A1 * | 10/2004 | Van Heerden | B81C 1/00269 |
| | | | | 53/485 |
| 2005/0059246 | A1 * | 3/2005 | Yamada | C23C 16/4401 |
| | | | | 438/689 |
| 2006/0011747 | A1 * | 1/2006 | Jahnke | B05B 14/00 |
| | | | | 239/370 |
| 2008/0187430 | A1 * | 8/2008 | Datta | H01L 21/67126 |
| | | | | 29/402.02 |
| 2009/0272324 | A1 * | 11/2009 | Balasubramanyam | |
| | | | | F16K 15/147 |
| | | | | 118/733 |
| 2011/0209663 | A1 * | 9/2011 | Endo | C23C 16/45565 |
| | | | | 118/719 |
| 2013/0119155 | A1 * | 5/2013 | Braspenning | B05B 13/005 |
| | | | | 239/299 |
| 2013/0269612 | A1 * | 10/2013 | Cheng | C23C 16/45565 |
| | | | | 239/128 |
| 2014/0187022 | A1 * | 7/2014 | Falster | H01L 21/322 |
| | | | | 438/476 |
| 2014/0187023 | A1 * | 7/2014 | Falster | H01L 21/6838 |
| | | | | 438/476 |
| 2015/0024671 | A1 * | 1/2015 | Taniyama | H01L 21/67017 |
| | | | | 454/193 |
| 2016/0354865 | A1 * | 12/2016 | McWhirter | H01L 21/28202 |
| 2018/0261483 | A1 * | 9/2018 | Woo | H01L 21/67393 |

* cited by examiner

[FIG. 1A]

PRIOR ART

[FIG. 1B]

PRIOR ART

SUBSTRATE PROCESSING APPARATUS WITH AN AIR CURTAIN IN A LOADING/UNLOADING PART

CROSS-REFERENCE TO RELATED APPLICATION

This application claims priority to and the benefit of Korean Patent Application No. 10-2019-0030097, filed on Mar. 15, 2019, the disclosure of which is incorporated herein by reference in its entirety.

BACKGROUND

1. Field of the Invention

The present disclosure relates to a substrate processing apparatus, and more specifically, to a substrate processing apparatus capable of blocking the introduction of external air and external particles into a chamber by forming an air curtain in a loading/unloading part, a loading/unloading zone, when the chamber is open.

2. Discussion of Related Art

Recently, with the rapid development of an information and communication field and popularization of information media such as computers, semiconductor devices are also rapidly developing. Further, various methods have been researched and developed to reduce the size of a discrete device formed on a substrate and maximize device performance according to a trend of high integration of the semiconductor devices in terms of its functionality.

Generally, the semiconductor devices are manufactured by repeatedly performing a plurality of substrate treatments such as lithography, deposition and etching, coating of photoresist, development, cleaning, and drying processes.

Each process is performed using a process fluid suitable for each purpose, and a suitable process environment is required for each process.

Each process is generally performed by accommodating a substrate in a chamber or bath in which a corresponding process environment is formed, and can be performed by accommodating a substrate in a sealed chamber to prevent the introduction of external particles.

Particles, such as metal impurities, organic matter, and the like remain on the substrate when each process is performed, and the contaminants cause a process defect of the substrate and adversely affect product yield and reliability.

Accordingly, in order to remove the particles, cleaning and drying processes repeatedly performed when each process is completed are very important.

Figure 1A:
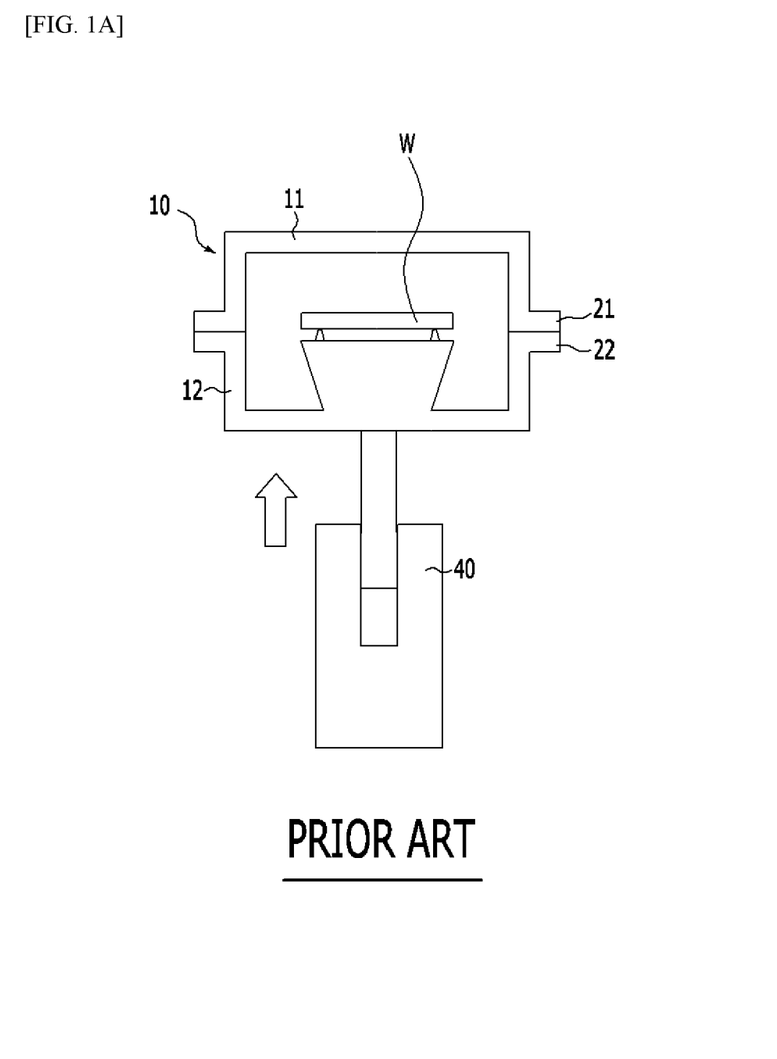
FIG. 1A and FIG. 1B are a schematic view illustrating a substrate processing apparatus according to the related art.
Figure 1B:
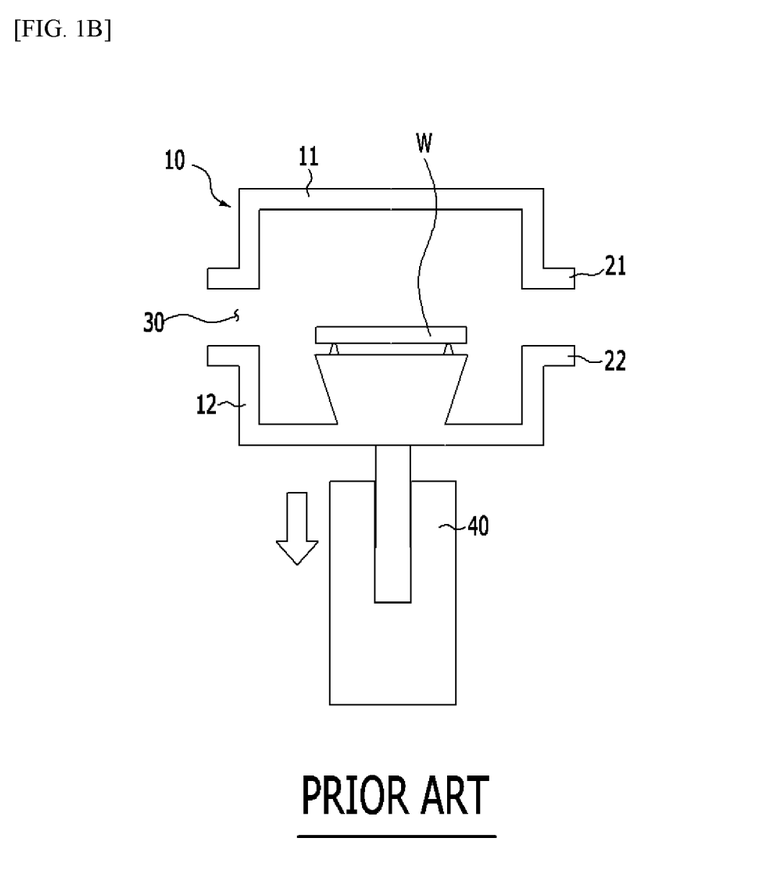

With reference to FIG. 1A and FIG. 1B, a single-wafer type substrate processing apparatus according to the related art and a substrate processing method using the same will be described.

The substrate processing apparatus according to the related art includes, a chamber 10 which accommodates and processes a substrate W in a sealed substrate processing space formed by coupling of a first housing 11 and a second housing 12, and a driving part 40 configured to move up and down while supporting the second housing 12 to open and close the chamber 10.

The chamber 10 is open when the substrate W is loaded into the chamber 10 or unloaded from the chamber 10 to the outside, and maintains a sealed state while the substrate W is processed in the chamber 10.

The driving part 40 is formed of a cylinder which performs up and down driving.

As shown in FIG. 1A, when the cylinder is elongated, the second housing 12 ascends, and accordingly, a flange part 21 of the first housing 11 and a flange part 22 of the second housing 12 are coupled to seal the chamber 10.

As shown in FIG. 1B, when the cylinder contracts, the second housing 12 descends, and accordingly, the chamber 10 is open and a loading/unloading part 30 through which the inside and the outside of the chamber 10 communicate is formed between the flange part 21 of the first housing 11 and the flange part 22 of the second housing 12.

According to the substrate processing apparatus of the related art, when the chamber 10 is open, external air and external particles can be introduced into the chamber 10 through the loading/unloading part 30.

Accordingly, a substrate processing environment in the chamber 10 can be adversely affected, and a defect of the substrate can occur.

As an example of the prior art of the above-described substrate processing apparatus, there is Korean Laid-Open Patent No. 10-2015-0064494.

SUMMARY OF THE INVENTION

The present disclosure is directed to providing a substrate processing apparatus f capable of preventing the introduction of external air and external particles into a chamber by forming an air curtain at in a loading/unloading part when the chamber is open.

According to an aspect of the present disclosure, there is provided a substrate processing apparatus including a chamber in which a space is formed, and a fluid injection part configured to inject a fluid from an outer side of a loading/unloading part, by which the inside and the outside of the chamber are connected, to form an air curtain.

The fluid injection part may inject the fluid in a vertically downward direction or obliquely inject the fluid downward and to the outer side of the chamber.

In the chamber formed by coupling of a first housing and a second housing, the fluid injection part may be provided in a plural number at predetermined intervals along a circumference of a flange part of the first housing, and may also be provided in a ring shape along the circumference of the flange part of the first housing.

The fluid injection part may be provided with at least one injection part configured to inject the fluid, and the at least one injection part may be provided at a predetermined interval along the circumference of the flange part of the first housing or may be provided in a slit shape.

The fluid may be clean air or an inert gas.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which.

DETAILED DESCRIPTION OF EXEMPLARY EMBODIMENTS

Hereinafter, configurations and actions of a substrate processing apparatus according to the present disclosure will be described with reference to the accompanying drawings.

Here, detailed descriptions of contents described in the related art and overlapping contents will be omitted, and elements newly added in the present disclosure will be mainly described.

A first embodiment and a second embodiment of substrate processing apparatus according to the present disclosure will be described with reference to FIGS. 2 and 3.

Each of substrate processing apparatuses 1-1 and 1-2 according to the present disclosure includes a chamber 100 for accommodating and processing a substrate W therein, and a fluid injection part 200 forming an air curtain A by injecting a fluid to an outer side of a loading/unloading part 105 by which the inside and the outside of the chamber 100 are connected.

The substrate W may be a silicon wafer serving as a semiconductor substrate. However, the present disclosure is not limited thereto, and the substrate W may be a transparent substrate such as a glass substrate or the like used for a flat display device such as a liquid crystal display (LCD) or a plasma display panel (PDP). The shape and size of the substrate W are not limited to the drawings of the present disclosure, and the substrate W may have various shapes and sizes such as a circular plate, a quadrangular plate, and the like.

The process of processing the substrate W is performed by supplying at least one process fluid onto the substrate W.

In a process of cleaning the substrate W, a cleaner for removing contaminants on the substrate W is used as the process fluid.

The cleaner may be supplied in plural types according to types of contaminants to be processed. For example, an organic solvent or nitrogen ($N_2$) gas may be used to remove a resist. Further, water, hydrogen fluoride (HF), isopropyl alcohol (IPA), nitrogen ($N_2$) gas, or the like may be used to remove silicon oxide (SiO). In addition, hydrochloric acid (HCl), ozone ($O_3$), or nitrogen ($N_2$) gas may be used to remove metal. In addition, ozone ($O_3$) or nitrogen ($N_2$) gas may be used to remove organic matter other than a resist. In addition, ammonia water (APM), nitrogen ($N_2$) gas, or argon (Ar) may be used to remove other particles. In addition, water, isopropyl alcohol (IPA), and nitrogen ($N_2$) gas may be used to remove ions of fluorine (F), chlorine (Cl), or ammonia ($NH_4$).

In addition, in a process of drying the substrate W, a desiccant for drying the substrate W is used as the process fluid.

The desiccant is provided corresponding to the type of cleaning agent supplied onto the substrate W, and a supercritical fluid such as carbon dioxide ($CO_2$), water ($H_2O$), methane ($CH_4$), ethane ($C_2H_6$), propane ($C_3H_8$), ethylene ($C_2H_4$) propylene ($C_2H_2$), methanol ($C_2H_3OH$), ethanol ($C_2H_5OH$), sulfur hexafluoride ($SF_6$), acetone ($C_3H_8O$), or the like may be used as the desiccant.

The process fluid requires a substrate processing environment which satisfies a range of temperatures and pressures for processing the substrate W according to the type thereof, and the substrate processing environment is changed according to the type of the process fluid.

As an example, in the case of a substrate processing process using a supercritical fluid, a substrate processing environment which satisfies a high temperature greater than or equal to a critical temperature and a high pressure greater than or equal to a critical pressure is required so that the fluid may maintain a supercritical state.

The chamber 100 is formed so that a substrate processing space providing the substrate processing environment is formed therein.

To this end, the chamber 100 consists of a high rigidity material having a predetermined thickness, and consists of a material having high heat resistance and pressure resistance to withstand changes in temperature and pressure, and having chemical resistance and corrosion resistance so as not to affect the substrate processing process due to deterioration or corrosion in response to the cleaning agent or the desiccant.

Stainless steel (SUS) may be a material which satisfies the above conditions. The stainless steel has high rigidity, excellent heat resistance, corrosion resistance, chemical resistance, accessibility and economic advantages, and thus is one of the most used materials for constituting the chamber 100.

The chamber 100 is open when the substrate W is loaded into the chamber 100 or unloaded to the outside from the chamber 100, and maintains a sealed state while the processing of the substrate W is performed in the chamber 100.

The chamber 100 is formed of a first housing 110 and a second housing 120 coupled to form a sealed substrate processing space therein.

The first housing 110 may be provided to maintain a fixed position, and since a driving part 104 is connected to the second housing 120, the second housing 120 moves by driving of the driving part 104 to be coupled to or separated from the first housing 110, and thus the chamber 100 may be opened and closed.

In this case, the first housing 110 may be formed to be coupled to an upper portion of the second housing 120, and the second housing 120 may be moved up and down by the driving of the driving part 104 to be coupled to or separated from the first housing 110.

The driving unit 104 may be formed of a cylinder which is moved up and down, may be formed of a motor, and may be formed using a rack and pinion gear so that rotational driving is converted to linear driving, to move the second housing 120 in various ways.

Flange parts 111 and 121 may be formed in a coupling portion at which the first housing 110 and the second housing 120 are coupled.

When the second housing 120 descends and is separated from the first housing 110, a space between the flange part 111 of the first housing 110 and the flange part 121 of the second housing 120 is open, and the loading/unloading part 105 through which the substrate W is loaded or unloaded is formed.

The fluid injection part 200 is formed so that a gas supply tank (not shown) which supplies the fluid is connected thereto, and at least one injection part 201 from which the fluid is injected is formed therein.

The fluid may be a purge gas, which is clean air, may be an inert gas, and specifically, may be nitrogen gas ($N_2$).

The air curtain A formed of the fluid serves to block the loading/unloading part 105 to prevent the introduction of external air and external particles into the substrate processing space in the chamber 100.

Since the fluid injection part 200 is provided at an outer side of the chamber 100, and specifically, is provided at the flange part 111 of the first housing 110, the air curtain A may be formed at an outer side of the loading/unloading part 105.

Figure 2:
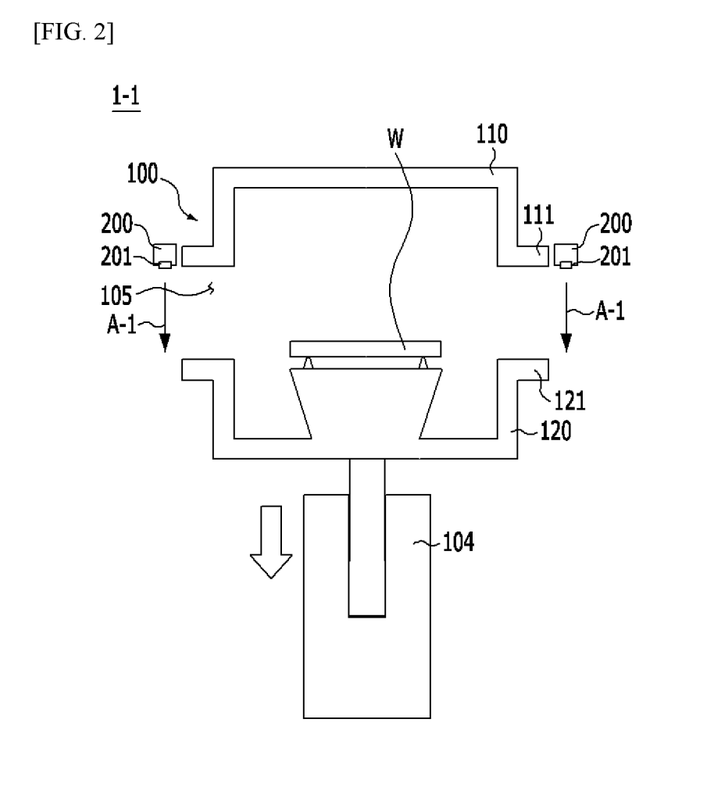
FIG. 2 is a schematic view illustrating a substrate processing apparatus according to a first embodiment of the present disclosure.

As shown in FIG. 2, the substrate processing apparatus 1-1 according to the first embodiment of the present disclosure may be formed so that the injection part 201 is provided at a lower side of the fluid injection part 200 to inject the fluid toward the loading/unloading part 105 in a vertically downward direction.

Accordingly, an air curtain A-1 in a vertically downward direction from the flange portion 111 of the first housing 110 to the flange portion 121 of the second housing 120 is formed.

The air curtain A-1 in the vertical downward direction may prevent the introduction of the outside air and external particles by tightly blocking the loading/unloading part 105 in a vertical direction.

Figure 3:
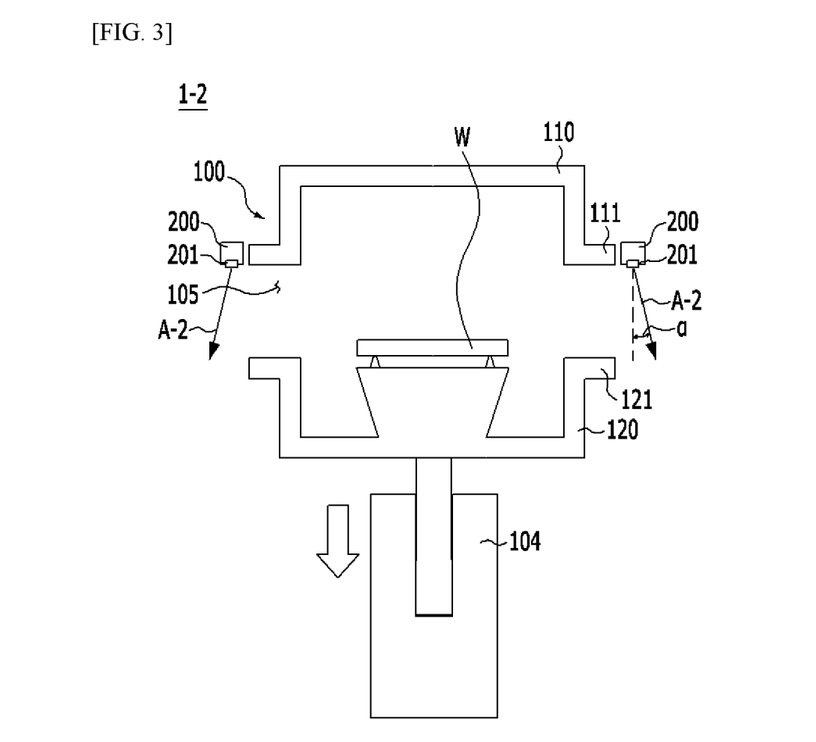
FIG. 3 is a schematic view illustrating a substrate processing apparatus according to a second embodiment of the present disclosure.

Further, as shown in FIG. 3, the substrate processing apparatus 1-2 according to the second embodiment of the present disclosure follows the configuration of the first embodiment, and may be formed so that the injection part 201 provided under the fluid injection part 200 obliquely injects the fluid downward and to the outer side of the chamber 100.

Accordingly, an air curtain A-2 in an obliquely downward direction from the flange portion 111 of the first housing 110 to an outer side of the flange portion 121 of the second housing 120 is formed.

The air curtain A-2 in the obliquely downward direction not only may prevent the introduction of external air and external particles which descend, but also may prevent a change in an inner environment of the chamber 100 due to vortices that may occur by minimizing collisions between the fluid and the flange portion 121 of the second housing 120.

In this case, an inclination angle α of the air curtain A-2 in the obliquely downward direction may be formed to be 5° to 15° outward from a vertical direction.

Figure 4:
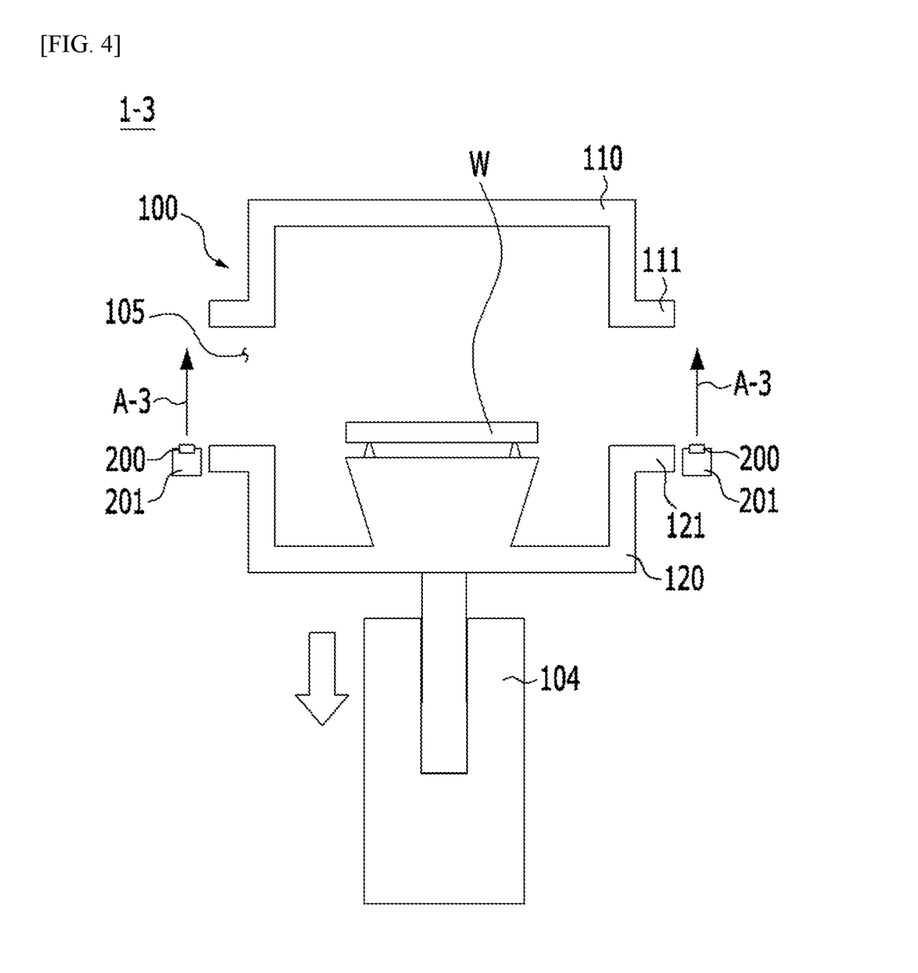
FIG. 4 is a schematic view illustrating a substrate processing apparatus according to a third embodiment of the present disclosure.

Further, as shown in FIG. 4, a substrate processing apparatus 1-3 according to a third embodiment of the present disclosure follows the configuration of the first embodiment, and may be formed so that the fluid injection part 200 is provided at the flange portion 121 of the second housing 120, and the injection part 201 is provided at an upper side of the fluid injection part 200 to inject a fluid in a vertically upward direction.

Accordingly, an air curtain A-3 in a vertically upward direction from the flange part 121 of the second housing 120 to the flange part 111 of the first housing 110 is formed.

The air curtain A-3 in the vertically upward direction may prevent the introduction of external air and external particles by pushing the external air and the external particles descending from an upper side of the chamber 100 to block an approaching path which approaches the loading/unloading part 105.

Figure 5:
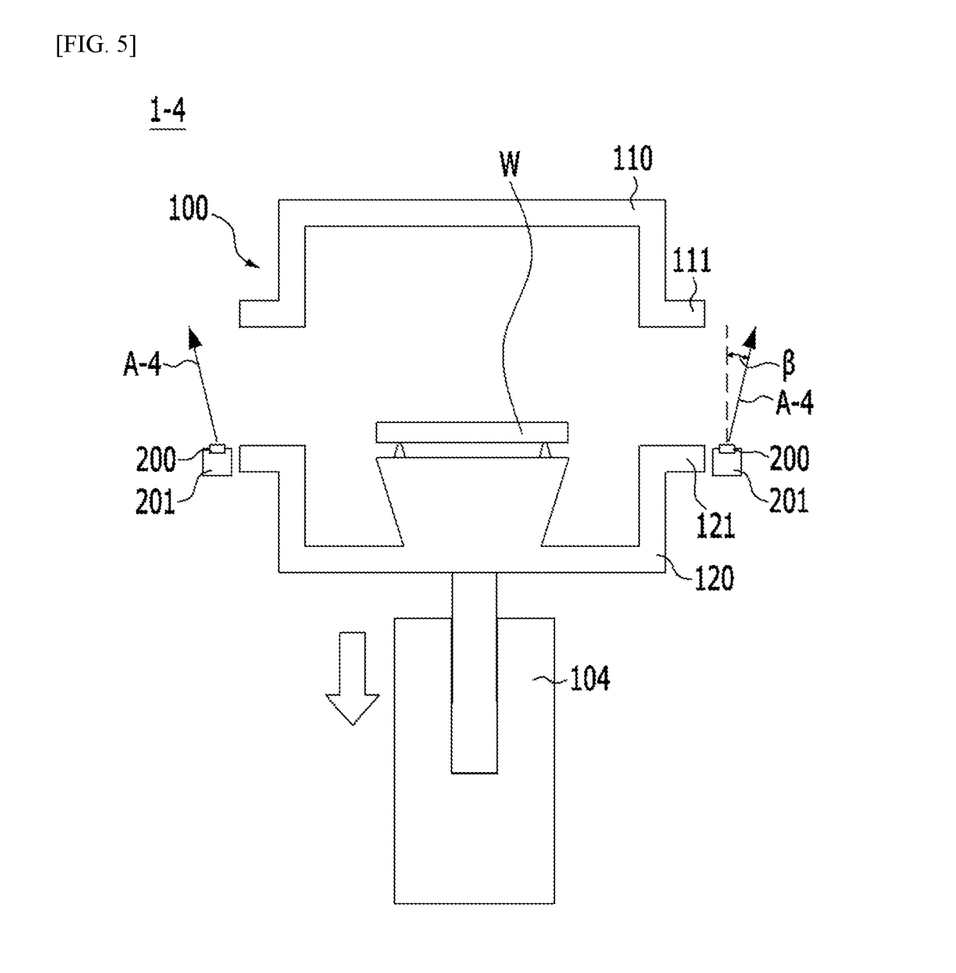
FIG. 5 is a schematic view illustrating a substrate processing apparatus according to a fourth embodiment of the present disclosure.

Further, as shown in FIG. 5, a substrate processing apparatus 1-4 according to a fourth embodiment of the present disclosure follows the configuration of the third embodiment, and may be formed so that the injection part 201 obliquely injects the fluid upward and to the outer side of the chamber 100.

Accordingly, an air curtain A-4 in an obliquely upward direction from the flange part 121 of the second housing 120 to an outer side of the flange part 111 of the first housing 110 is formed.

The air curtain A-4 in the obliquely upward direction not only may block an approaching path which approaches the loading/unloading part 105 by pushing external air and external particles descending from an upper side of the chamber 100, but also may prevent a change in an inner environment of the chamber 100 due to vortices that may occur by minimizing collisions between the fluid and the flange part 111 of the first housing 110.

In this case, an inclination angle β of the air curtain A-2 in the obliquely upward direction may be formed to be 5° to 15° outward from a vertical direction.

Figure 6:
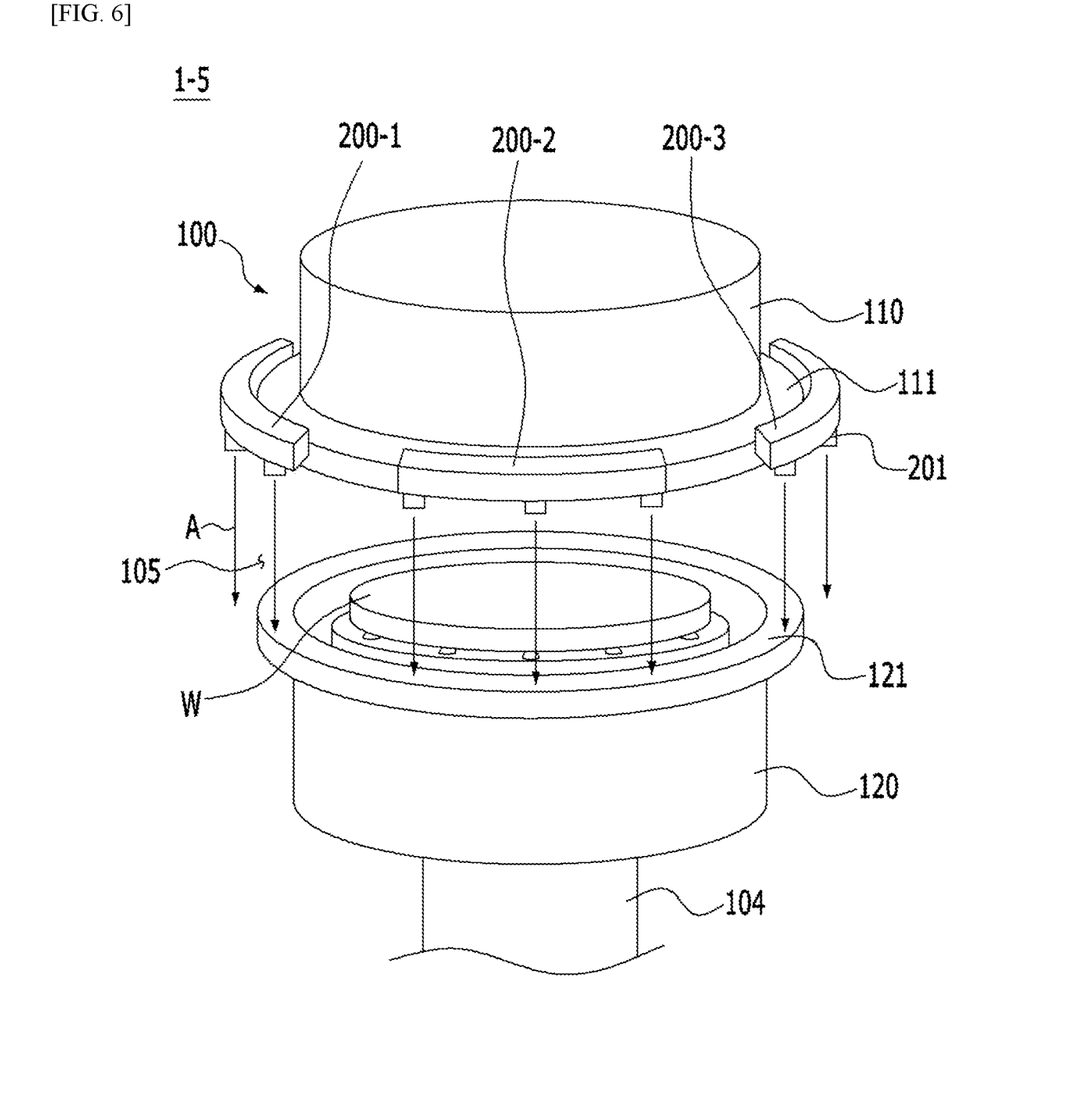
FIG. 6 is a schematic view illustrating a substrate processing apparatus according to a fifth embodiment of the present disclosure.

Further, a fifth embodiment of the substrate processing apparatus according to the present disclosure will be described with reference to FIG. 6.

A substrate processing apparatus 1-5 according to the fifth embodiment of the present disclosure follows the configuration of the first embodiment, but is different from the configuration of the first embodiment in that fluid injection parts 200-1, 200-2, and 200-3 are formed in a plural number along a circumference of the flange part 111 of the first housing 110.

The flange part 111 of the first housing 110 and the flange part 121 of the second housing 120 are respectively formed in ring shapes at ends of the first housing 110 and the second housing 120, and accordingly, the loading/unloading part 105 of the chamber 100 may also be formed in a ring shape between the flange part 111 of the first housing 110 and the flange part 121 of the second housing 120.

Since the plurality of fluid injection parts 200-1, 200-2, and 200-3 according to the fifth embodiment are provided at predetermined intervals along the flange part 111 of the first housing 110, air curtains A which uniformly block the ring-shaped loading/unloading part 105 are formed.

Further, as at least one injection part 201 provided in the plurality of fluid injection parts 200-1, 200-2, and 200-3 is provided at a predetermined interval along the flange part 111 of the first housing 110, the air curtains A may be more compactly formed.

Figure 7:
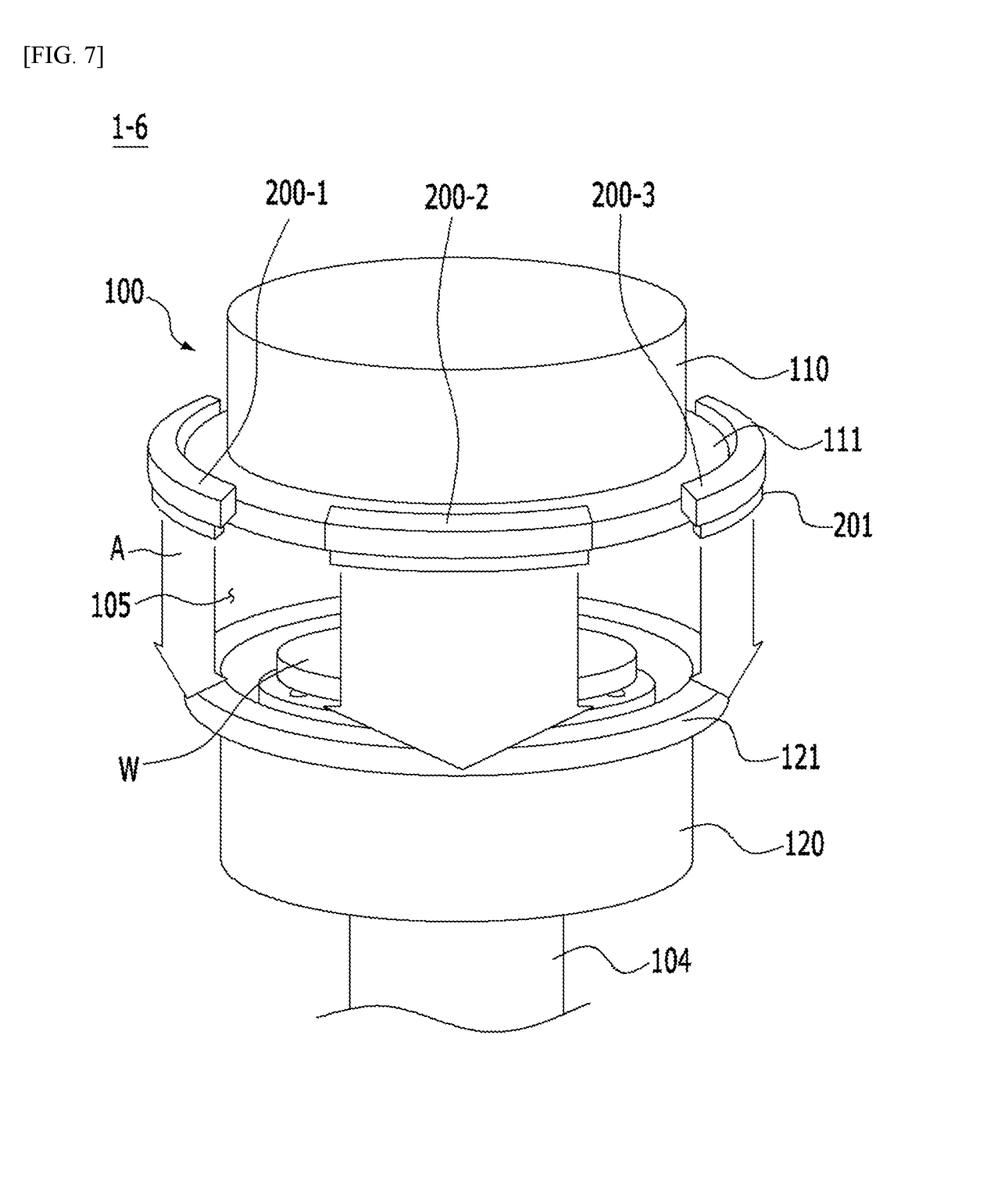
FIG. 7 is a schematic view illustrating a substrate processing apparatus according to a sixth embodiment of the present disclosure.

In addition, a sixth embodiment of the substrate processing apparatus according to the present disclosure will be described with reference to FIG. 7.

A substrate processing apparatus 1-6 according to the sixth embodiment of the present disclosure follows the configuration of the fifth embodiment, but is different from the configuration of the fifth embodiment in that at least one injection part 201 provided in the plurality of fluid injection parts 200-1, 200-2, and 200-3 is formed in a slit shape.

According to the sixth embodiment, since a fluid supplied to the plurality of fluid injection parts 200-1, 200-2, and 200-3 is injected through the at least one slit-shaped injection part 201, air curtains A which block a loading/unloading part 105 having a relatively large area are formed.

Figure 8:
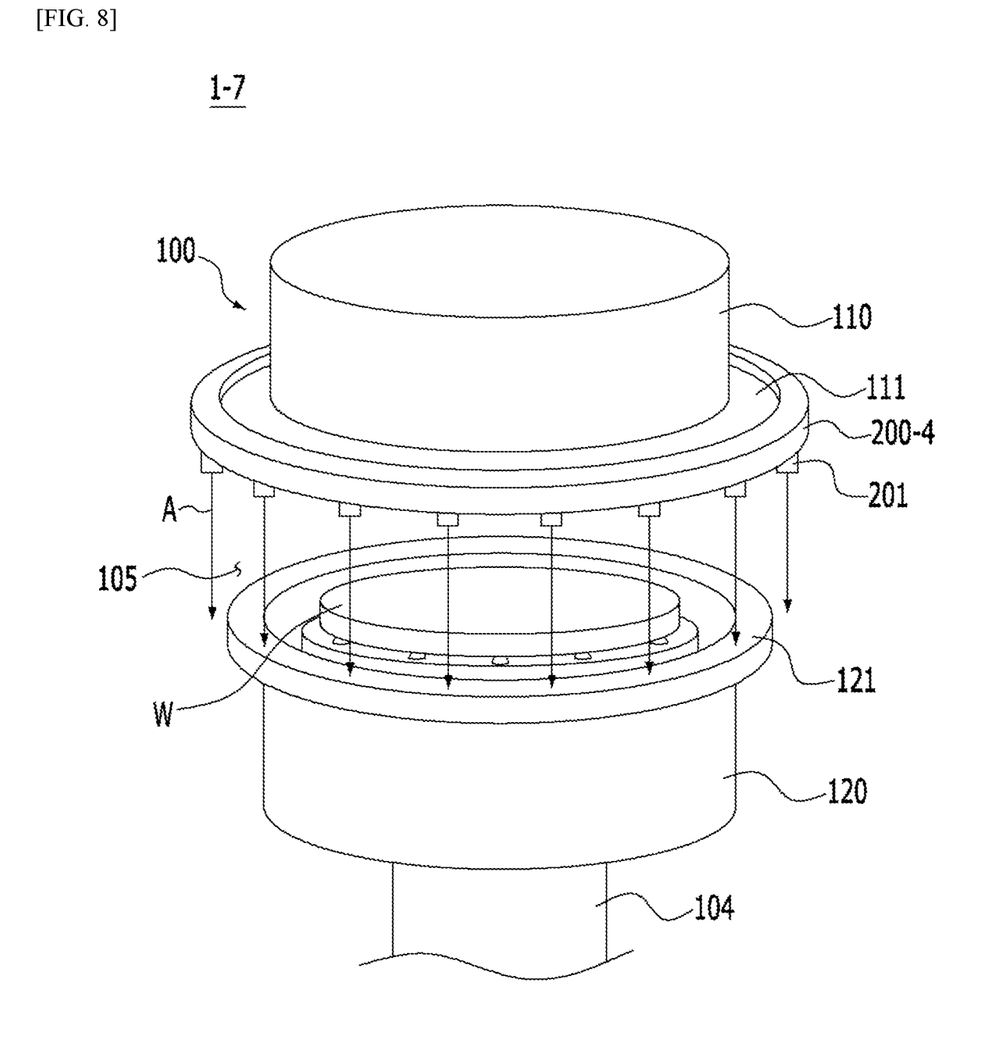
FIG. 8 is a schematic view illustrating a substrate processing apparatus according to a seventh embodiment of the present disclosure.

Further, a seventh embodiment of the substrate processing apparatus according to the present disclosure will be described with reference to FIG. 8.

A substrate processing apparatus 1-7 according to the seventh embodiment of the present disclosure follows the configuration of the first embodiment, but is different from the configuration of the first embodiment in that the fluid injection part 200-4 is formed in a ring shape along a circumference of the flange part 111 of the first housing 110.

Since at least one injection part 201 is uniformly provided at a predetermined interval in the fluid injection part 200-4, air curtains A which uniformly block a ring-shaped loading/unloading part 105 are formed.

Figure 9:
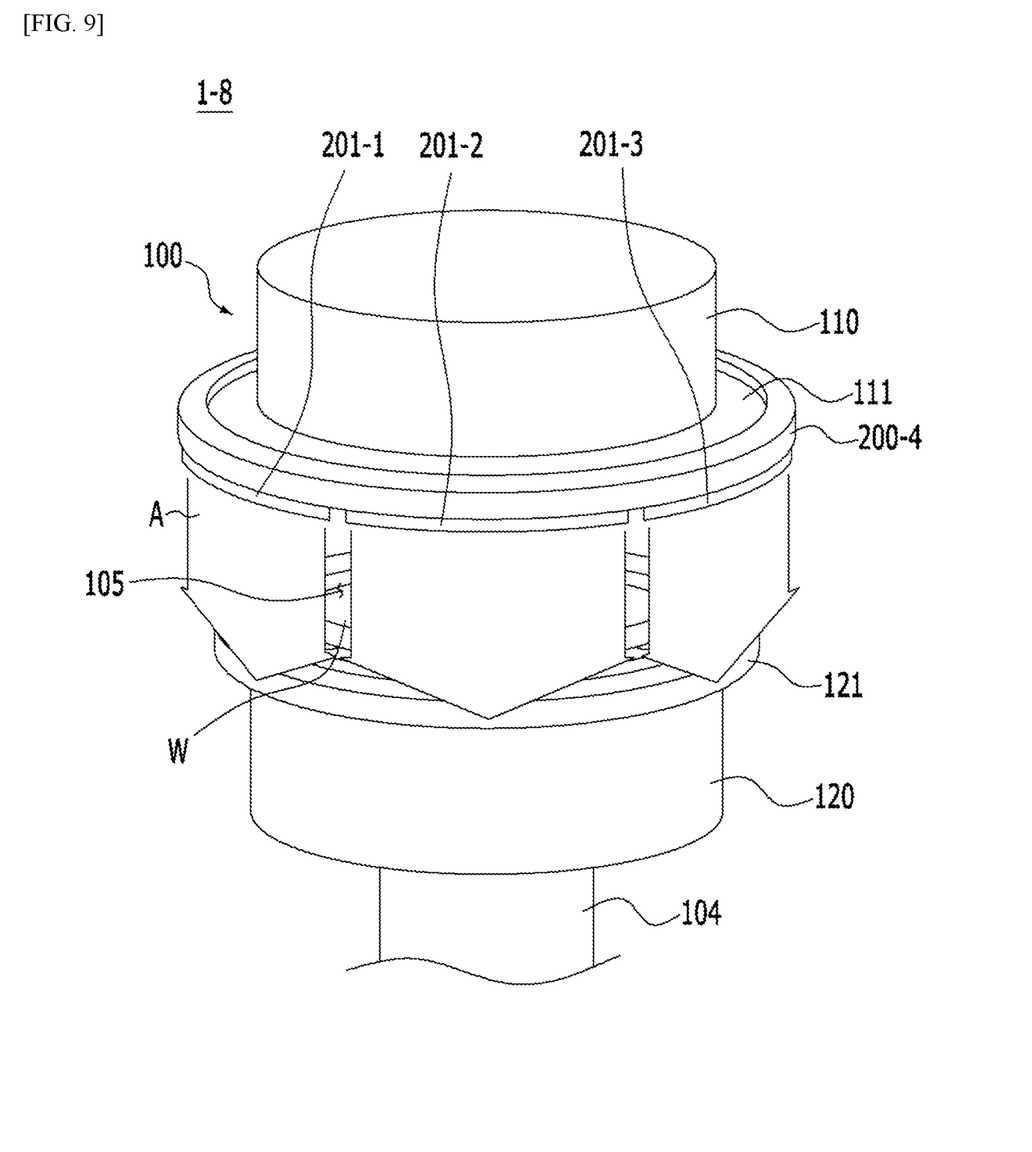
FIG. 9 is a schematic view illustrating a substrate processing apparatus according to an eighth embodiment of the present disclosure.

Further, an eighth embodiment of the substrate processing apparatus according to the present disclosure will be described with reference to FIG. 9.

A substrate processing apparatus 1-8 according to the eighth embodiment of the present disclosure follows the configuration of the seventh embodiment, but is different from the configuration of the seventh embodiment in that at least one injection part 201 provided in the fluid injection part 200-4 is formed in a slit shape.

According to the eighth embodiment, since a fluid supplied to the fluid injection part 200-4 is injected through the at least one slit-shaped injection part 201, air curtains A which block a loading/unloading part 105 having a relatively large area are formed.

As described above, according to the substrate processing apparatus of the present disclosure, since air curtains which block the outer side of the loading/unloading part 105 of the chamber 100 are formed by injecting a fluid from an air supply part 200, a defective occurrence rate of the substrate W may be reduced by preventing the introduction of external air and external particles into the substrate processing space in the chamber 100.

According to a substrate processing apparatus of the present disclosure, since the introduction of external air and external particles into a chamber is prevented by forming an air curtain which blocks a loading/unloading part when the chamber is open, a defective occurrence rate of a substrate can be reduced.

The present disclosure is not limited to the above-described embodiments, it will be apparent to those skilled in the art that the present disclosure may be modified without departing from the spirit of the present disclosure in the claims, and such a modification is included in the scope of the present disclosure.

What is claimed is:

1. A substrate processing apparatus comprising:
a chamber,
wherein the chamber comprises a first housing constituting an upper portion of the chamber, a second housing constituting a lower portion of the chamber, a first flange connected along the perimeter of the first housing, and a second flange connected along the perimeter of the second housing,
wherein the chamber is formed by coupling of the first housing and the second housing and the first flange and the second flange are coupled when the first housing and the second housing is coupled,
wherein the first flange comprises a first top surface, a first bottom surface, and a first outer side surface, and the second flange comprises a second top surface, a second bottom surface, and a second outer side surface, such that when the first flange and the second flange are coupled the first bottom surface of the first flange and the second top surface of the second flange are in direct contact against each other to close the chamber;
a loading/unloading zone formed between the first housing and the second housing when the first housing and the second housing are separated, wherein a substrate is loaded and unloaded through the loading/unloading zone; and
a fluid injection part directly attached to the first outer side surface or the second outer side surface such that the fluid injection part is configured to inject a fluid downward or upward, respectively, along the loading/unloading zone, wherein the first flange and the second flange extend in parallel in a first horizontal direction from the first housing and the second housing, respectively, and the fluid injection part is located on the first outer side extending past an outermost portion of the first flange in the first horizontal direction and an outermost portion of the second flange in the first horizontal direction or the fluid injection part is located on the second outer side extending past the outermost portion of the second flange in the first horizontal direction and the outermost portion of the first flange in the first horizontal direction.

2. The substrate processing apparatus of claim 1, wherein: the fluid injection part is directly attached to the first outer side surface and is configured to inject the fluid vertically and downward.

3. The substrate processing apparatus of claim 1, wherein: the fluid injection part is directly attached to the first outer side surface and is configured to obliquely inject the fluid downward and to an outer side of the chamber.

4. The substrate processing apparatus of claim 1, wherein: the fluid injection part is directly attached to the second outer side surface and is configured to inject the fluid vertically and upward.

5. The substrate processing apparatus of claim 1, wherein: the fluid injection part is directly attached to the second outer side surface and is configured to obliquely inject the fluid upward and to an outer side of the chamber.

6. The substrate processing apparatus of claim 3, wherein the fluid injection part is configured to obliquely inject the fluid in a direction inclined 5° to 15° from a vertical direction to the outer side of the chamber.

7. The substrate processing apparatus of claim 1, wherein the fluid injection part is provided in a plural number at predetermined intervals along a circumference of the first flange or the second flange.

8. The substrate processing apparatus of claim 1, wherein the fluid injection part is formed in a ring shape along a circumference of the first flange or the second flange.

9. The substrate processing apparatus of claim 1, wherein the fluid injection part is provided with at least one injection part configured to inject the fluid.

10. The substrate processing apparatus of claim 9, wherein the at least one injection part is formed in a slit shape.

11. The substrate processing apparatus of claim 9, wherein the at least one injection part is provided at a predetermined interval along a circumference of the first flange or the second flange.

12. The substrate processing apparatus of claim 1, comprising a gas supply tank connected to the fluid injection part to supply the fluid.

13. The substrate processing apparatus of claim 1, wherein the fluid is formed of at least one fluid among inert gas, nitrogen gas, and clean air.

14. The substrate processing apparatus of claim 1, wherein the first housing has a fixed position, a driving part is provided at the second housing, and the second housing moves to be coupled to or separated from the first housing by driving of the driving part, and thus the chamber is opened and closed.

15. The substrate processing apparatus of claim 14, wherein: the driving part is formed of a cylinder configured to move the second housing up and down such that the first housing and the second housing is coupled or separated, respectively.

16. The substrate processing apparatus of claim 5, wherein the fluid injection part is configured to obliquely inject the fluid in a direction inclined 5° to 15° from a vertical direction to the outer side of the chamber.

* * * * *